(12) United States Patent
Chang et al.

(10) Patent No.: US 9,728,624 B2
(45) Date of Patent: Aug. 8, 2017

(54) SEMICONDUCTOR TESTING DEVICES

(71) Applicant: International Business Machines Corporation, Armonk, NY (US)

(72) Inventors: Josephine B. Chang, Bedford Hills, NY (US); Isaac Lauer, Yorktown Heights, NY (US); Jeffrey W. Sleight, Ridgefield, CT (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/924,835

(22) Filed: Oct. 28, 2015

(65) Prior Publication Data

US 2017/0125550 A1 May 4, 2017

(51) Int. Cl.
*H01L 29/66* (2006.01)
*H01L 21/66* (2006.01)

(52) U.S. Cl.
CPC ........ *H01L 29/66795* (2013.01); *H01L 22/30* (2013.01); *H01L 29/66545* (2013.01)

(58) Field of Classification Search
CPC ............... H01L 29/66795; H01L 22/30; H01L 29/66545
See application file for complete search history.

(56) References Cited

U.S. PATENT DOCUMENTS

| | | | |
|---|---|---|---|
| 5,493,238 A | 2/1996 | Takeuchi | |
| 6,275,972 B1 | 8/2001 | Long et al. | |
| 6,514,778 B2 | 2/2003 | Huang et al. | |
| 6,750,673 B1 | 6/2004 | Huang et al. | |
| 7,405,090 B2 | 7/2008 | Jang | |
| 7,514,940 B1 | 4/2009 | Bu | |
| 9,385,236 B1* | 7/2016 | Sun | H01L 29/7853 |
| 2002/0167034 A1 | 11/2002 | Yamaguchi et al. | |
| 2011/0272764 A1* | 11/2011 | Kim | H01L 21/28273 257/368 |
| 2013/0313610 A1* | 11/2013 | Sell | H01L 21/02532 257/192 |
| 2014/0167172 A1* | 6/2014 | Chen | H01L 29/6681 257/368 |
| 2014/0183652 A1* | 7/2014 | Chern | H01L 27/0207 257/369 |
| 2015/0115373 A1* | 4/2015 | Yu | H01L 21/823418 257/401 |

(Continued)

*Primary Examiner* — Fernando L Toledo
*Assistant Examiner* — Neil Prasad
(74) *Attorney, Agent, or Firm* — Cantor Colburn LLP; Vazken Alexanian

(57) ABSTRACT

A method for fabricating a test structure on a wafer includes forming a fin on a substrate, forming a first gate stack over the fin, the first gate stack having a first gate width, the first gate stack including a gate dielectric layer having a first thickness, forming a second gate stack over the fin, the second gate stack having a second gate width, the second gate stack including a gate dielectric layer having a second thickness, and forming a third gate stack over the fin, the third gate stack having a third gate width, the third gate stack including a gate dielectric layer having the second thickness, wherein the first gate stack is arranged a first distance from the second gate stack and the second gate stack is arranged the first distance from the third gate stack.

20 Claims, 18 Drawing Sheets

(56) References Cited

U.S. PATENT DOCUMENTS

2016/0099338 A1* 4/2016 Chang .............. H01L 29/66545
257/347
2016/0111336 A1* 4/2016 Chang ............. H01L 21/823481
257/401

* cited by examiner

SEMICONDUCTOR TESTING DEVICES

BACKGROUND

The present invention relates to semiconductor device, and more specifically, to testing devices on semiconductor wafers.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistors, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

In the fabrication of semiconductor devices on semiconductor wafers, the designed specifications of the devices may not always be achieved when the final devices are formed. Various inconsistencies between the designed specifications and the fabricated devices may be caused by any number of factors that arise in during the fabrication process.

It is desirable to measure the sizes of the resultant devices in particular the gate widths to determine the final dimensions of the fabricated devices. Often such measurements may be performed by imaging processes that include scanning electron microscopes however, such processes are time consuming and thus, are costly

SUMMARY

According to an embodiment of the present invention, a method for fabricating a test structure on a wafer comprises forming a semiconductor fin on a substrate, forming a first dummy gate stack over the fin, the first dummy gate stack having a first width, forming a second dummy gate stack over the fin, the second dummy gate stack having a second width, forming a third dummy gate stack over the fin, the third dummy gate stack having a third width, the first dummy gate stack is spaced a first distance from the second dummy gate stack, the second dummy gate stack spaced the first distance from the third dummy gate stack, forming a source/drain regions on exposed portions of the fin, removing the first dummy gate, the second dummy gate, and the third dummy gate to expose channel regions of the fin, depositing a layer of dielectric material over the channel regions of the fin, depositing a block mask to obscure a channel region of the fin, removing the layer of dielectric material from exposed channel regions of the fin, removing the block mask, depositing a high-k dielectric layer, and depositing a work function metal to form a first gate stack, a second gate stack, and a third gate stack.

According to another embodiment of the present invention, a method for fabricating a test structure on a wafer includes forming a fin on a substrate, forming a first gate stack over the fin, the first gate stack having a first gate width, the first gate stack including a gate dielectric layer having a first thickness, forming a second gate stack over the fin, the second gate stack having a second gate width, the second gate stack including a gate dielectric layer having a second thickness, and forming a third gate stack over the fin, the third gate stack having a third gate width, the third gate stack including a gate dielectric layer having the second thickness, wherein the first gate stack is arranged a first distance from the second gate stack and the second gate stack is arranged the first distance from the third gate stack.

According to yet another embodiment of the present invention, a testing structure on a substrate comprises a semiconductor fin arranged on the substrate, a first gate stack arranged over the fin, the first gate stack having a first gate width, the first gate stack including a gate dielectric layer having a first thickness, a second gate stack arranged over the fin, the second gate stack having a second gate width, the second gate stack including a gate dielectric layer having a second thickness, and a third gate stack arranged over the fin, the third gate stack having a third gate width, the third gate stack including a gate dielectric layer having the second thickness, wherein the first gate stack is arranged a first distance from the second gate stack and the second gate stack is arranged the first distance from the third gate stack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-15C illustrate an exemplary method for fabricating a semiconductor test structure.

FIG. 1 illustrates a side view of a semiconductor on insulator (SOI) wafer having an insulator layer and a semiconductor layer.

FIG. 2 illustrates a side view of the resultant structure following the patterning and removal of portions of the sacrificial layer.

FIG. 3 illustrates a side view of the resultant structure following the formation of sidewalls.

FIG. 4 illustrates a side view of the resultant structure following the removal of the mandrel portion.

FIG. 5 illustrates a side view of the formation of semiconductor fins following an etching process.

FIG. 6 illustrates a top view of the semiconductor fin structure shown in FIG. 5

FIG. 7 illustrates a side view of the resultant structure following the deposition of a dummy gate.

FIG. 8 illustrates a top view of the dummy gate stacks arranged on the insulator layer.

FIG. 9 illustrates a top view following the formation of sidewall spacers adjacent to the dummy gate stacks.

FIG. 10 illustrates a top view of following the formation of source/drain regions over exposed portions of the dielectric layer.

FIG. 15C illustrates a cut-away view of the structure along the line B-B of FIG. 15A.

DETAILED DESCRIPTION

Figure 1:
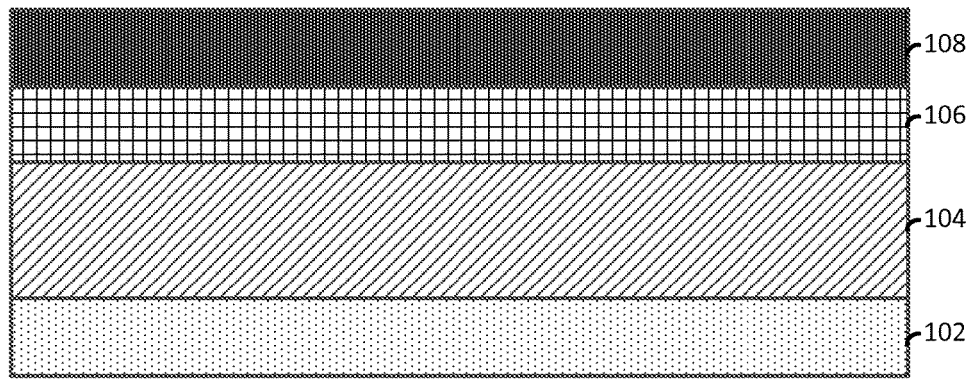

The measurement of the dimensions of semiconductor devices such as field effect transistor (FET) devices often includes measuring the gate width (channel length) of the devices. Such measurements may be performed using imaging methods that include using a scanning electron microscope. However, such imaging methods are often time consuming and thus, costly.

Another method for measuring the gate width of a semiconductor device includes measuring the capacitance of the device. When the capacitance is measured, a parasitic capacitance is also measured. To determine the actual gate width, the parasitic capacitance should be determined to distinguish between the parasitic capacitance and the actual capacitance of the device.

The methods and structures described below provides for an arrangement of "test" devices having particular spacing and materials that when known, may be used to test capacitance and distinguish between actual device capacitance and the parasitic capacitance of the devices. Thus, when the parasitic capacitance is determined, the actual capacitance of the devices, and in-turn the gate width of the devices may be determined as a function of the actual capacitance of the devices.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In this regard, FIGS. 1-15C illustrate an exemplary method for fabricating a semiconductor test structure. The illustrated exemplary method is but one method for fabricating the resultant test structure.

Referring to FIG. 1 illustrates a side view of a semiconductor on insulator (SOI) wafer. An SOI wafer includes a thin layer of a semiconducting material atop an insulating layer (e.g., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The SOI wafer of FIG. 1 includes an insulator layer 102, a semiconductor layer 104 disposed on the insulator layer 102, an dielectric layer 106 arranged on the semiconductor layer 104, and a sacrificial layer 108 arranged on the dielectric layer 106. The sacrificial layer 108 may include, for example silicon nitride, amorphous carbon, or silicon oxide materials.

Non-limiting examples of suitable materials for the dielectric layer 106 include Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 2:
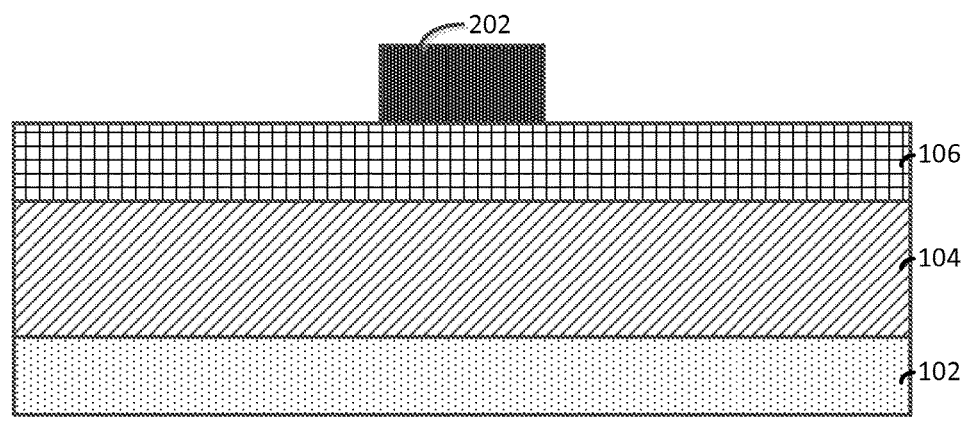

FIG. 2 illustrates a side view of the resultant structure following the patterning and removal of portions of the sacrificial layer 108 to expose portions of the dielectric layer 106, which forms a mandrel portion 202. The sacrificial layer 108 may be patterned using, for example, a lithographic patterning and etching process such as, for example, reactive ion etching (RIE).

Lithography can include forming a photoresist (not shown) on the sacrificial layer 108, exposing the photoresist to a desired pattern of radiation, and then developing the exposed photoresist with a resist developer to provide a patterned photoresist on top of the sacrificial layer 108. At least one etch is employed to transfer the pattern from the patterned photoresist into the sacrificial layer 108. The etching process may include a dry etch (e.g., reactive ion etching, plasma etching, ion beam etching, or laser ablation). The etching process may alternatively include a wet chemical etch (e.g., with potassium hydroxide, or sulfuric acid and hydrogen peroxide). In some exemplary embodiments, both dry etching and wet chemical etching processes may be used. After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, $O_2$, $N_2$, $H2/N2$, $O_3$, $CF_4$, or any combination thereof.

Figure 3:
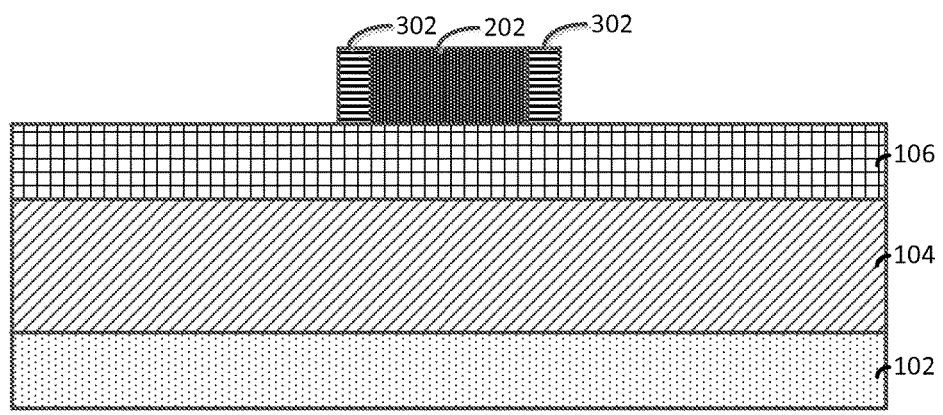

FIG. 3 illustrates a side view of the resultant structure following the formation of sidewalls 302 adjacent to the mandrel portion 202. The sidewalls 302 are formed by, for example, a sidewall image transfer process that deposits the sidewalls 302 adjacent to the mandrel portion 202.

Figure 4:
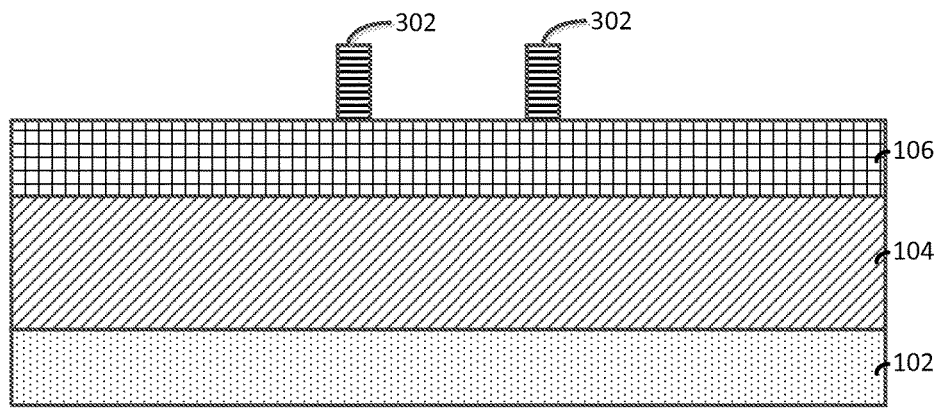

FIG. 4 illustrates a side view of the resultant structure following the removal of the mandrel portion 202 (of FIG. 3) using, for example, a selective etching process.

Figure 5:
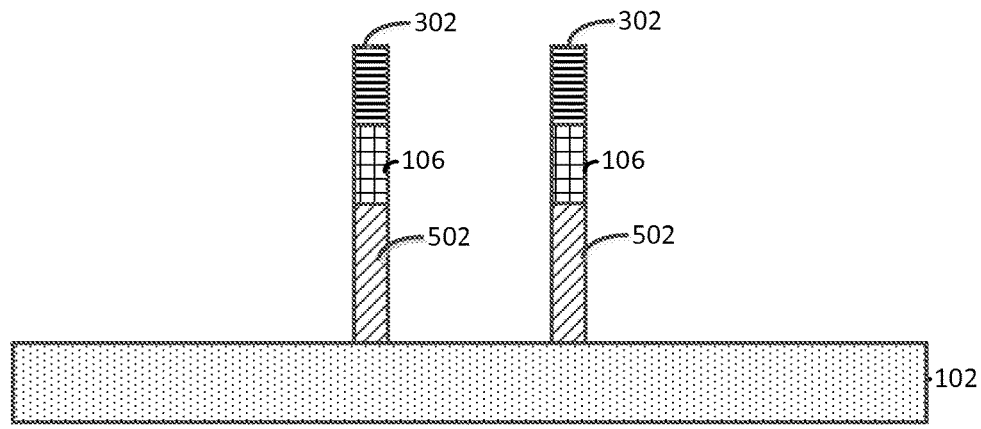

FIG. 5 illustrates a side view of the formation of semiconductor fins 502 following an etching process such as, for example, reactive ion etching that removes exposed portions of the dielectric layer 106, the semiconductor layer 104, and exposes portions of the insulator layer 102.

Figure 6:
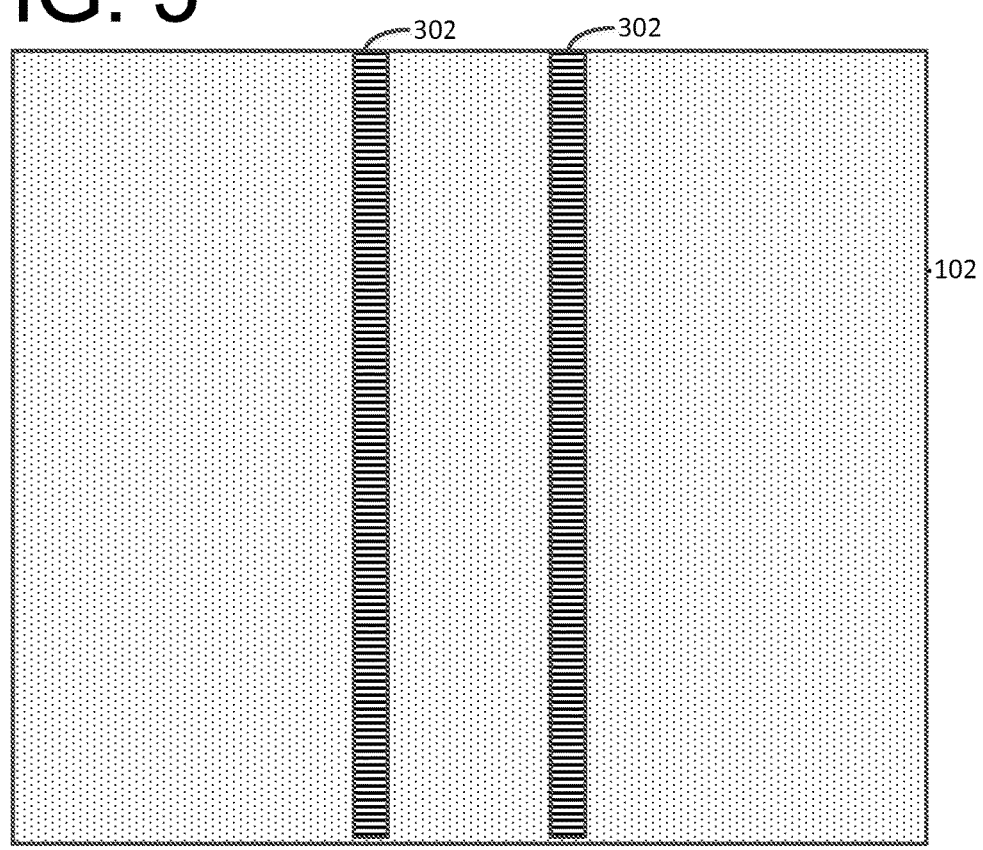

FIG. 6 illustrates a top view of the fin structure shown in FIG. 5

Figure 7:
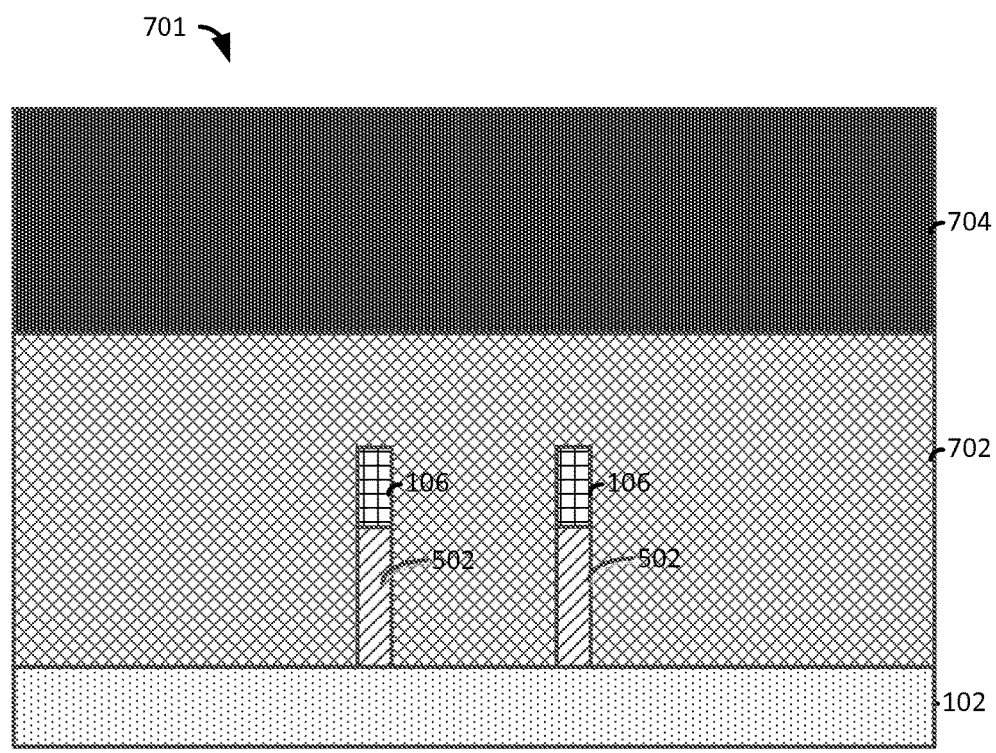

FIG. 7 illustrates a side view of the resultant structure following the deposition of a layer of dummy gate (sacrificial gate) material 702 that may include, for example, a polysilicon material, or oxide material. Following the deposition of the layer of dummy gate material 702, a hard mask material 704 is deposited on the dummy gate material 702.

Following the deposition of the hard mask material 704, a patterning and etching process is performed to remove portions of the hard mask material 704 and the dummy gate material 702 to expose portions of the insulator layer 102 and form dummy gate stacks 701.

Figure 8:
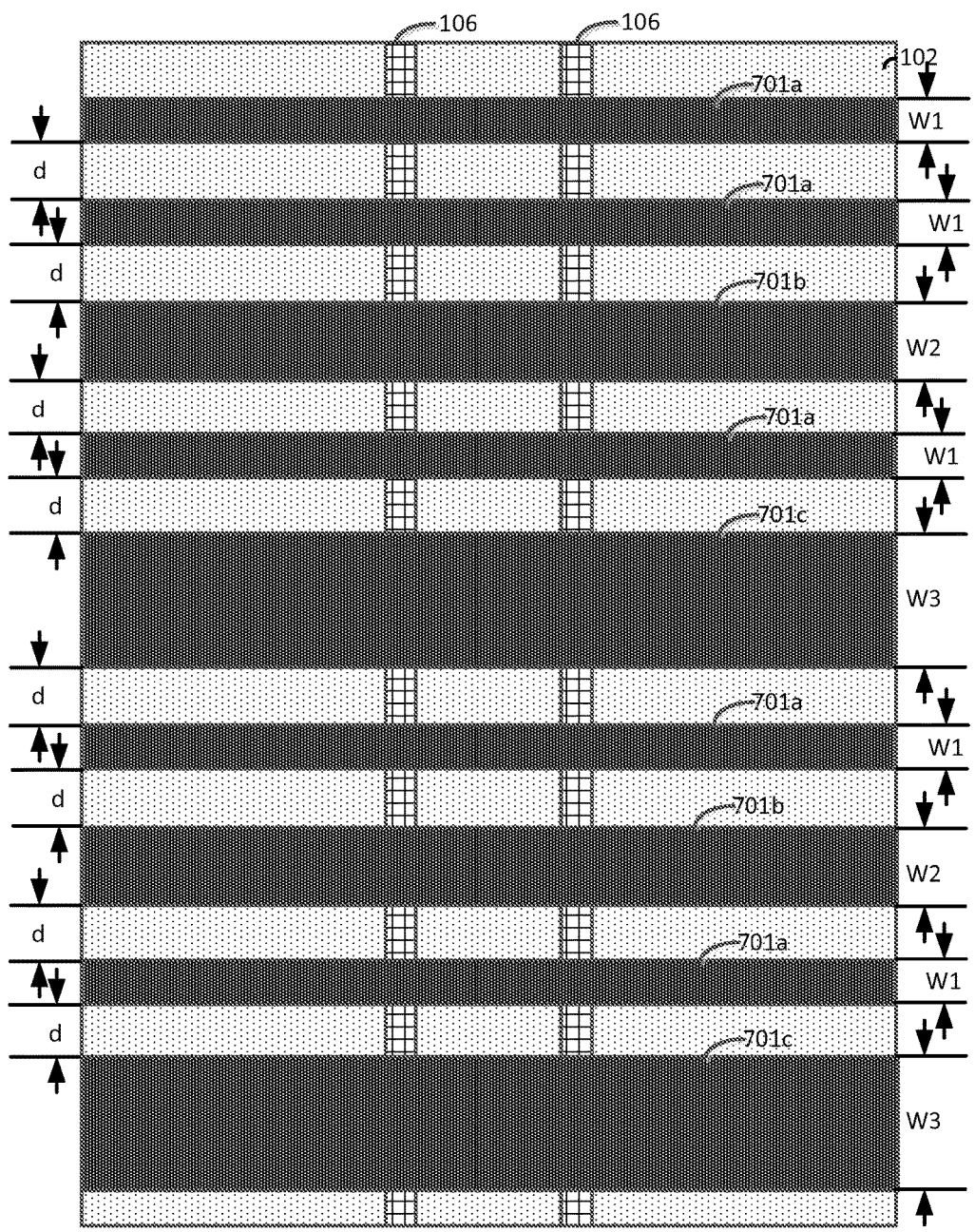

FIG. 8 illustrates a top view of the dummy gate stacks 701 arranged on the insulator layer 102. The dummy gate stacks 701 include dummy gate stacks 701a that have a width of L1, dummy gate stacks 701b that have a width of L2, and dummy gate stacks 701c that have a width of L3, where L1<L2<L3. The dummy gate stacks are evenly spaced such that the side walls of the dummy gate stacks 701 are spaced a uniform distance d from each other.

Figure 9:
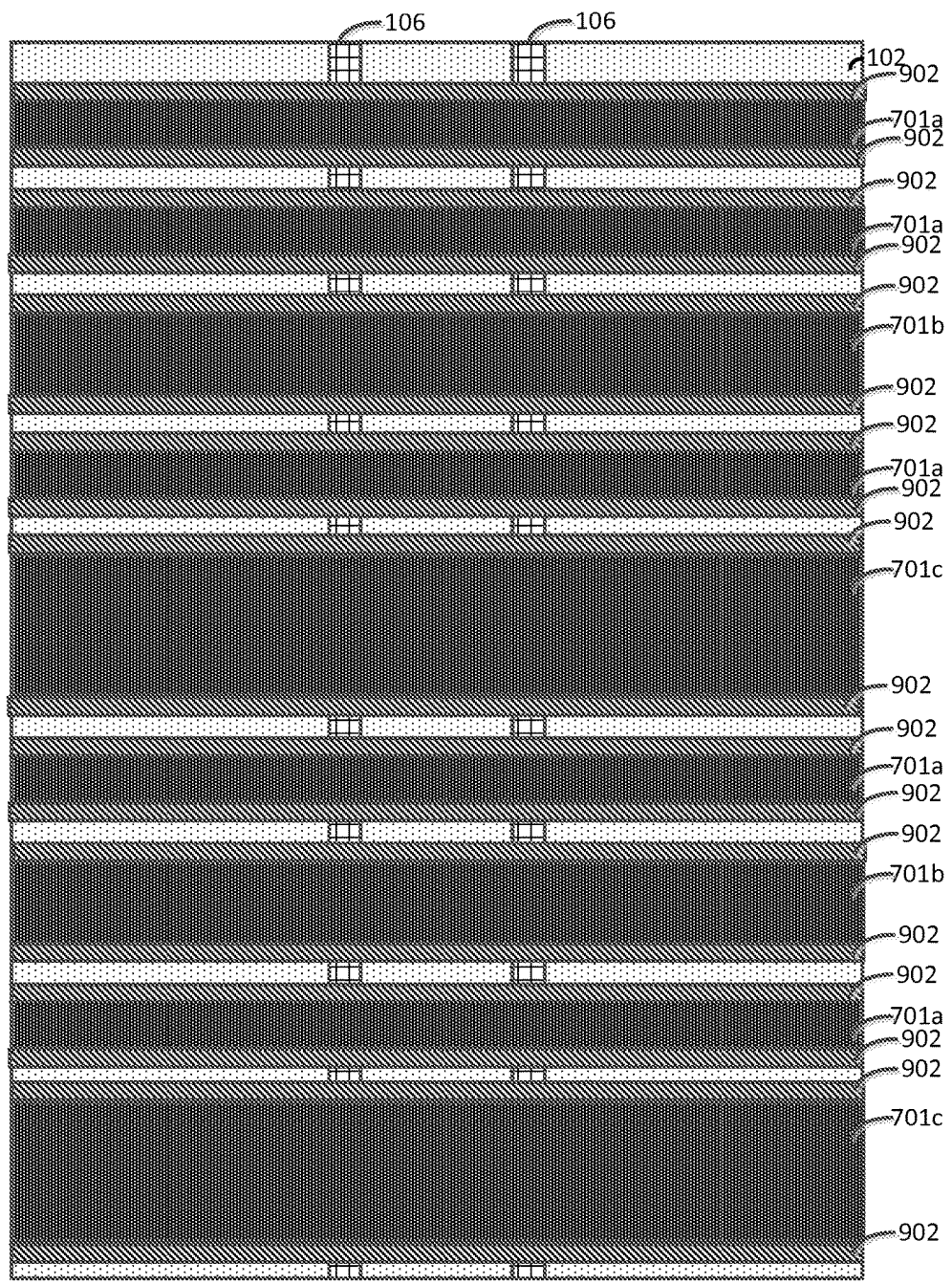

FIG. 9 illustrates a top view following the formation of sidewall spacers 902 adjacent to the dummy gate stacks 701. The spacers 902 are formed from a low-k spacer material. The low-k spacer material may contain Si, N, and at least one element selected from the group consisting of C and B. Additionally, the low-k spacer material may contain Si, N, B, and C. For example, the low-k spacer material may include SiBN, SiCN, SiBCN, or any combination thereof. The spacers 902 are formed by depositing a layer of the low-k spacer material and performing an anisotropic etching process such as, for example, reactive ion etching that forms the resultant spacers 902.

Figure 10:
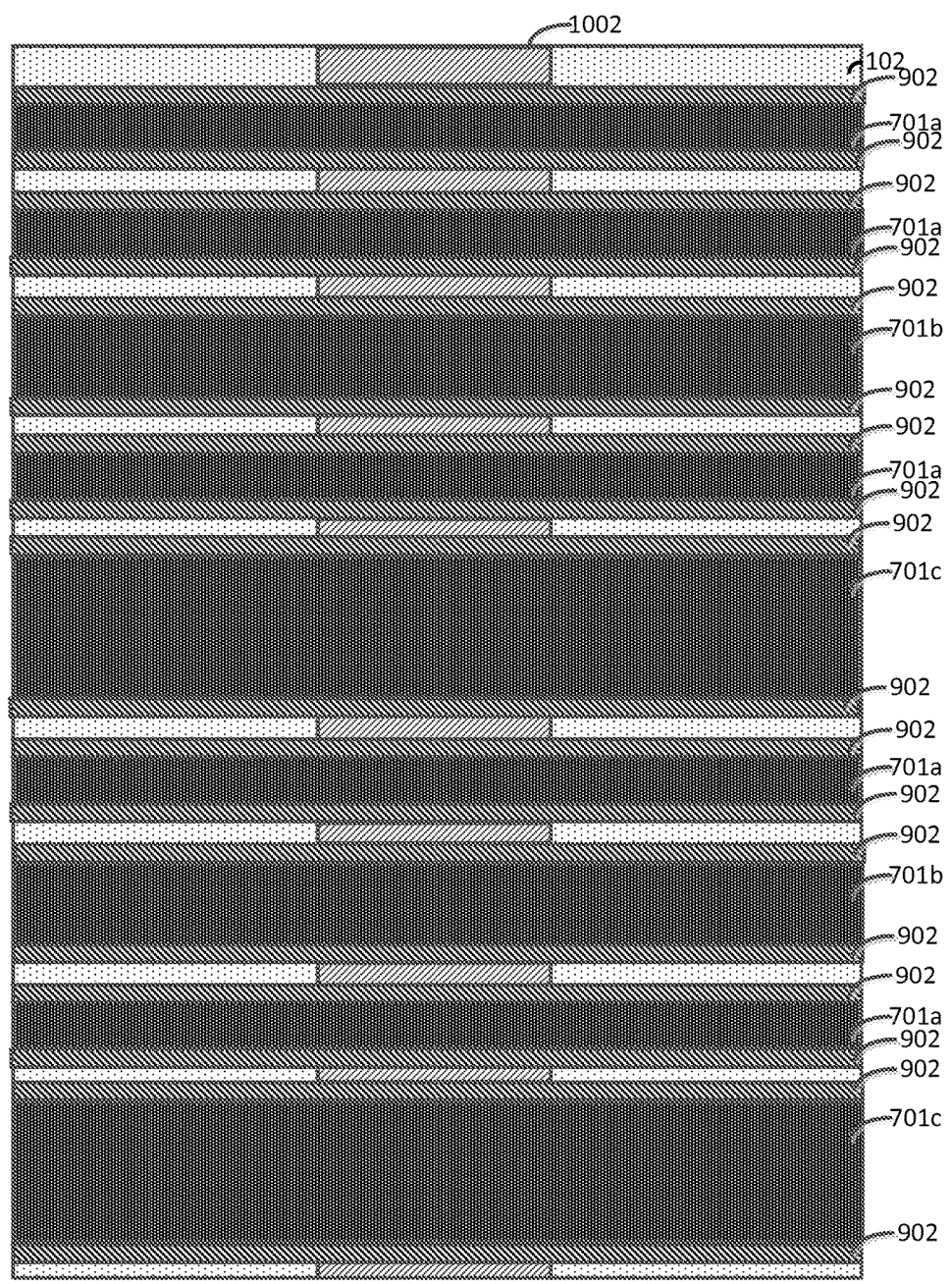

FIG. 10 illustrates a top view of following the formation of source/drain regions 1002 over exposed portions of the dielectric layer 106 on the semiconductor fins 502 (of FIG. 5). The source/drain regions 1002 of the illustrated embodiment are formed by, an epitaxial growth process.

An epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device.

Figure 11A:
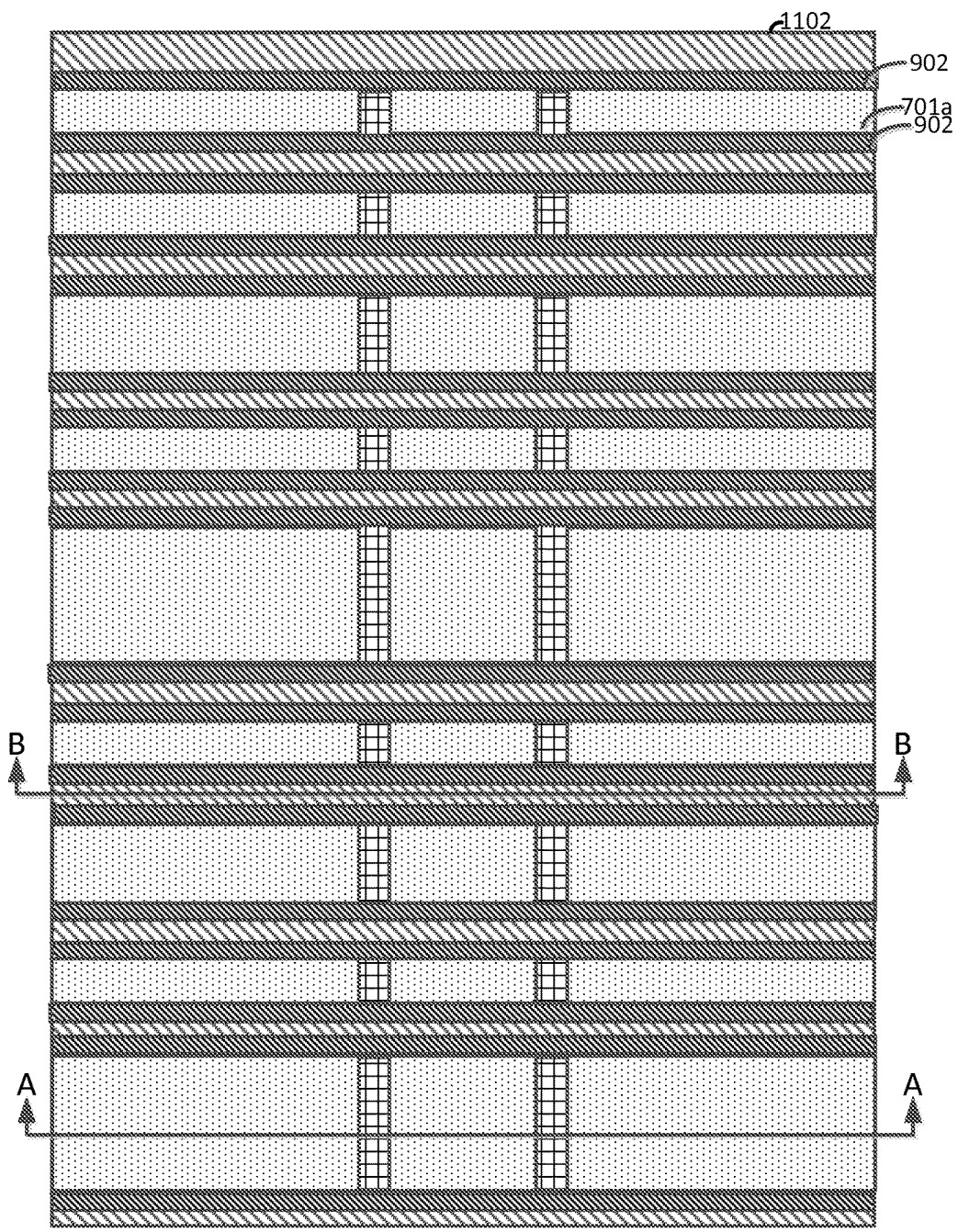
FIG. 11A illustrates a top view of the resultant structure following the deposition of an insulator layer.

FIG. 11A illustrates a top view of the resultant structure following the deposition of an insulator layer 1102 that may include, for example, an oxide material over exposed portions of the source/drain regions 1002 (of FIG. 10) and portions of the insulator layer 102, and the removal of the dummy gate stacks 701 (of FIG. 10). The removal of the dummy gate stacks 701 exposes channel regions of the fins 502 (of FIG. 5). The dummy gate stacks 701 may be removed by any suitable selective etching process.

Figure 11B:
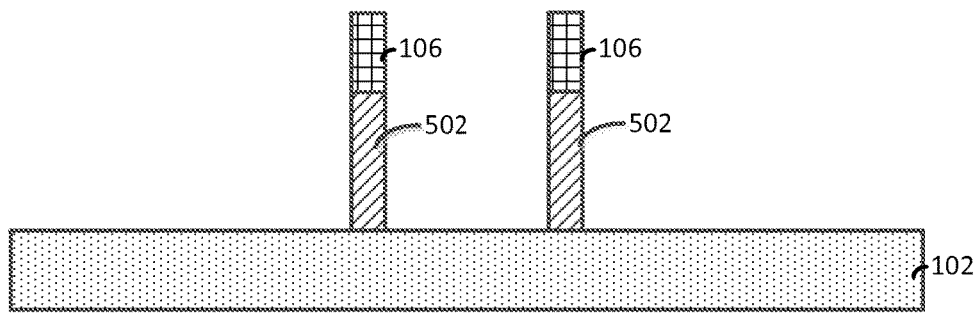
FIG. 11B illustrates a cut-away view of the structure along the line A-A of FIG. 11A.

FIG. 11B illustrates a cut-away view along the line A-A of FIG. 11A. Referring to FIG. 11B, the insulator layer 102 is shown with the fins 502 and the oxide layer 106 disposed on the fins 502.

Figure 11C:
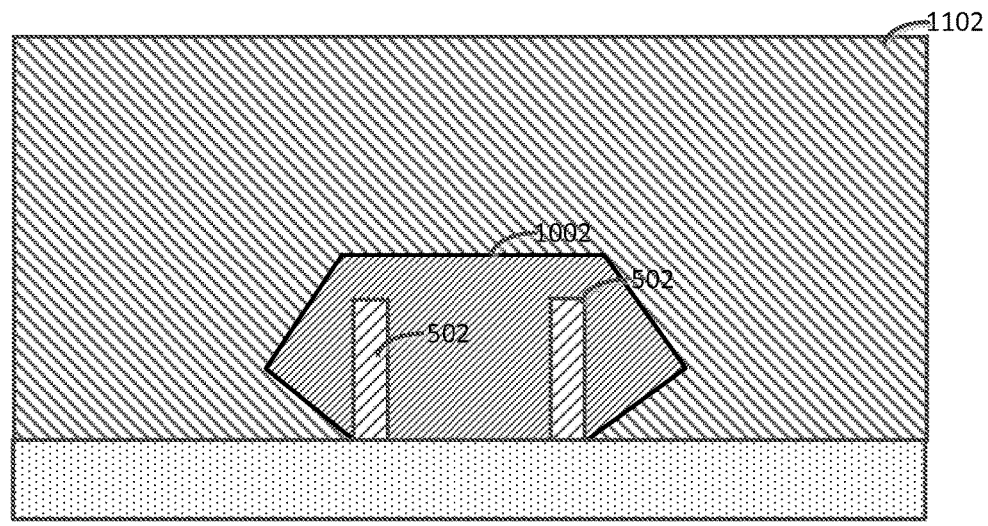
FIG. 11C illustrates a cut-away view of the structure along the line B-B of FIG. 11A.

FIG. 11C illustrates a cut-away view along the line B-B of FIG. 11A. The semiconductor fins 502 are shown with the source/drain region 1002 grown over the fins 502. The insulator layer 1102 is disposed over the source/drain region 1002.

Figure 12A:
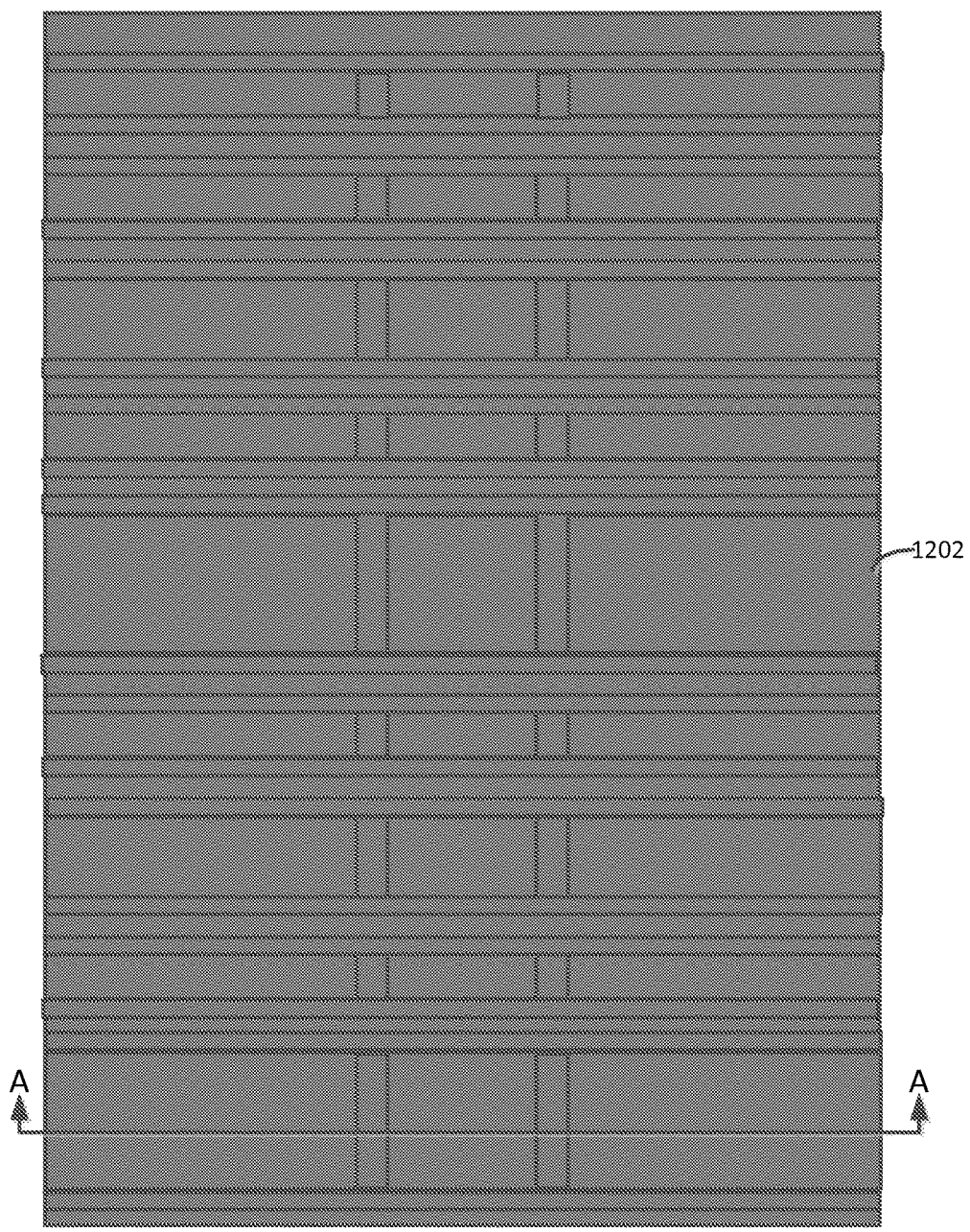
FIG. 12A illustrates a top view of the resultant structure following the deposition of a dielectric material layer.

FIG. 12A illustrates a top view of the resultant structure following the deposition of a dielectric material layer 1202. The dielectric material 1202 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The dielectric layer 1202 may include, for example, $SiO_2$, SiN, or $SiNO_x$.

Figure 12B:
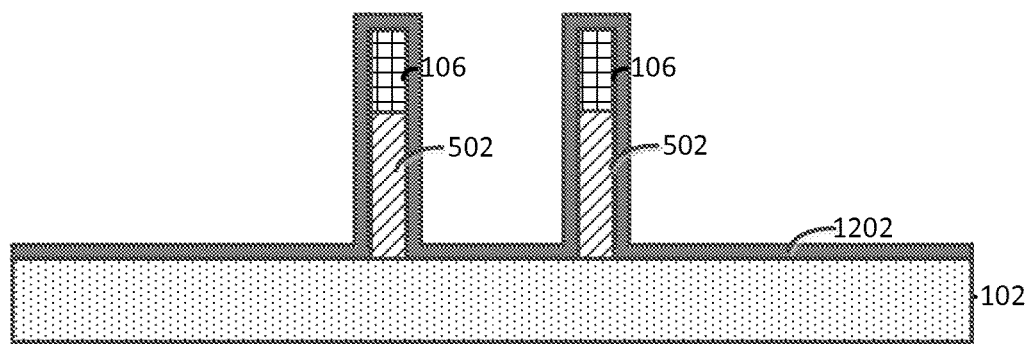
FIG. 12B illustrates a cut-away view of the structure along the line A-A of FIG. 12A.

FIG. 12B illustrates a cut-away view along the line A-A of FIG. 12A. Referring to FIG. 12B, the dielectric material layer 1202 is formed over exposed portions of the insulator layer 102, the semiconductor fins 502, and the dielectric layer 106.

Figure 13A:
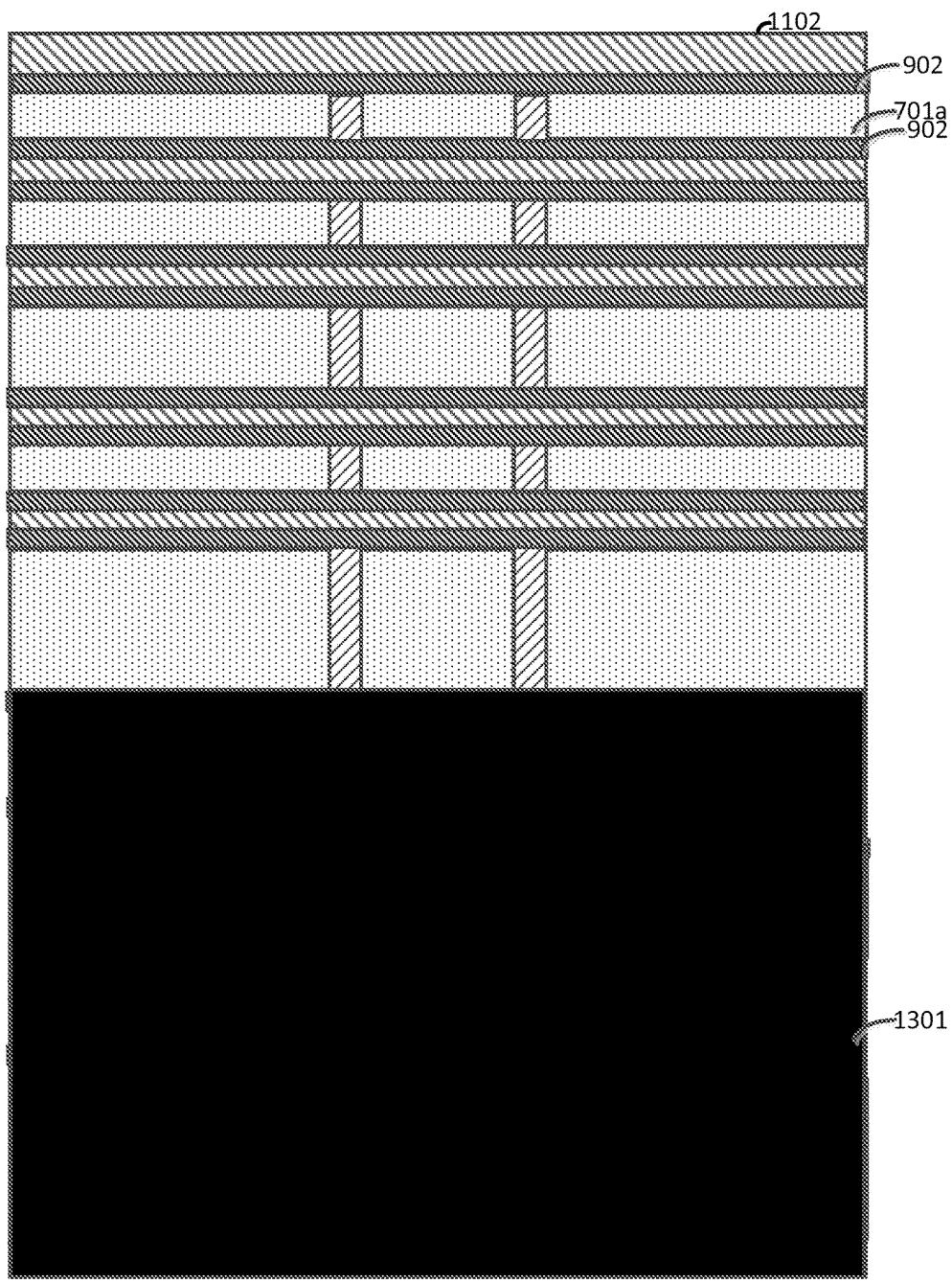
FIG. 13A illustrates a top view following the formation of a block mask over a portion of the dielectric material layer.

FIG. 13A illustrates a top view following the formation of a block mask 1301 over a portion of the dielectric material layer 1202. Following the patterning of the block mask, a selective etching process is performed that removes exposed portions of the dielectric layer 1202 and the dielectric layer 106 (of FIG. 8) to expose portions of the fins 502.

Figure 13B:
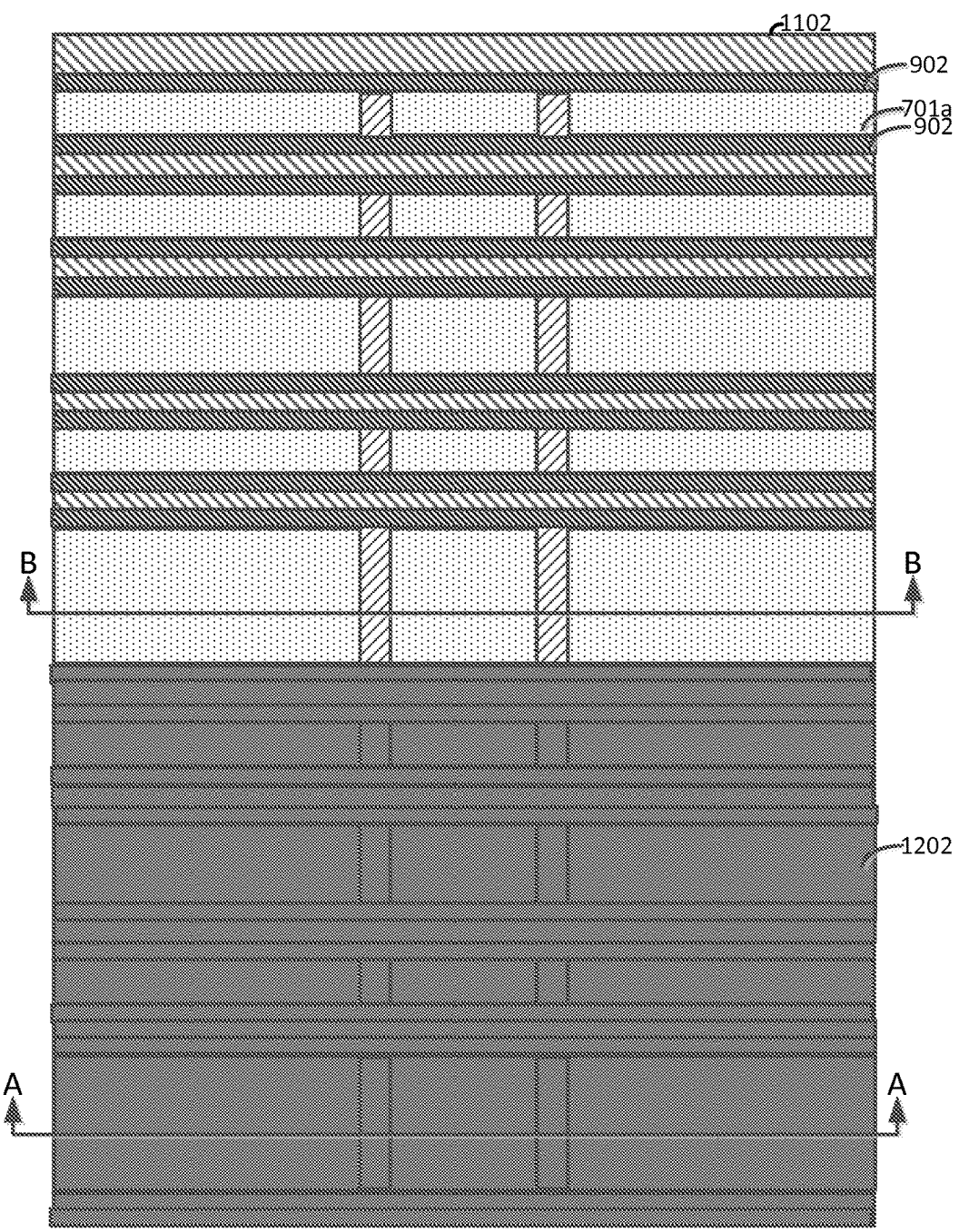
FIG. 13B illustrates a top view following the removal of the block mask of FIG. 13.
Figure 13C:
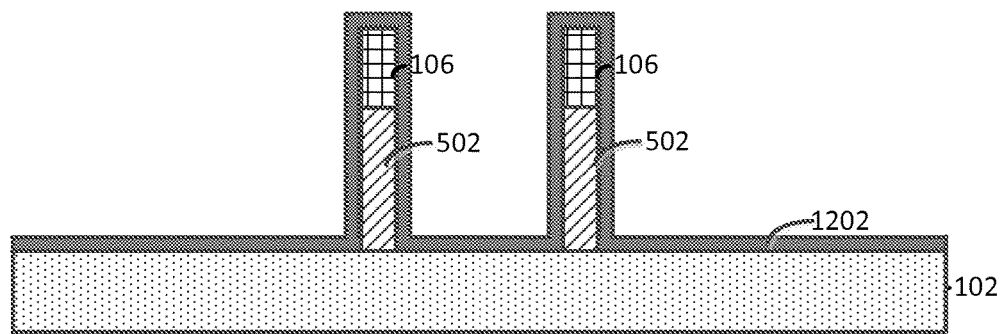
FIG. 13C illustrates a cut-away view of the structure along the line A-A of FIG. 13A.
Figure 13D:
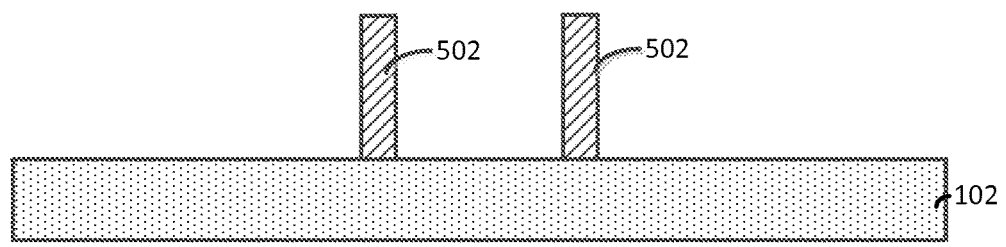
FIG. 13D illustrates a cut-away view of the structure along the line B-B of FIG. 13A.

FIG. 13B illustrates a top view following the removal of the block mask 1301 of FIG. 13A. FIG. 13C illustrates a cut-away view along the line A-A of FIG. 13A. FIG. 13D illustrates a cut-away view along the line B-B of FIG. 13A.

Figure 14A:
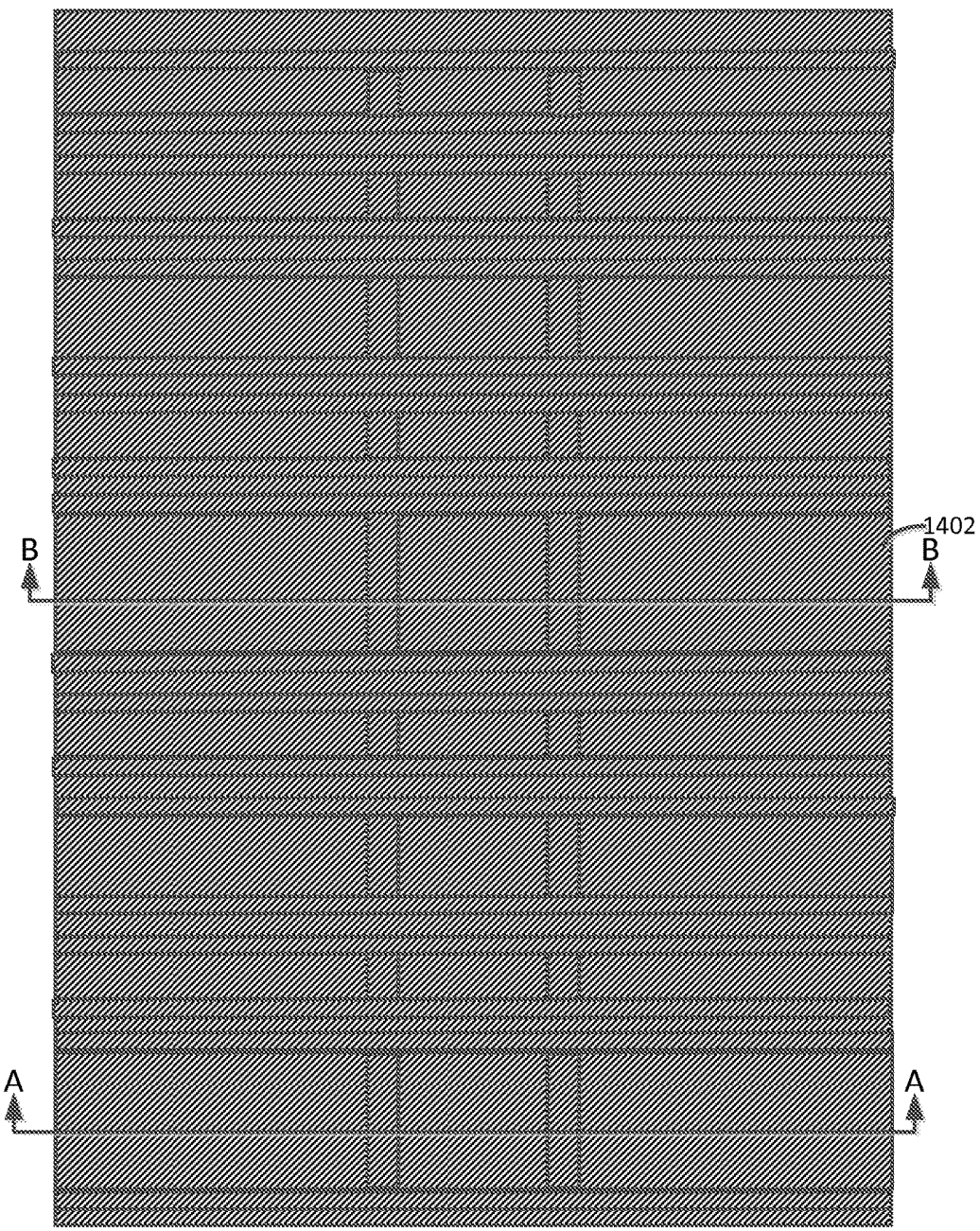
FIG. 14A illustrates a top view of the formation of a high-k dielectric layer.

FIG. 14A illustrates a top view of the formation of a high-k dielectric layer 1402. The high-k dielectric layer 1402 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Figure 14B:
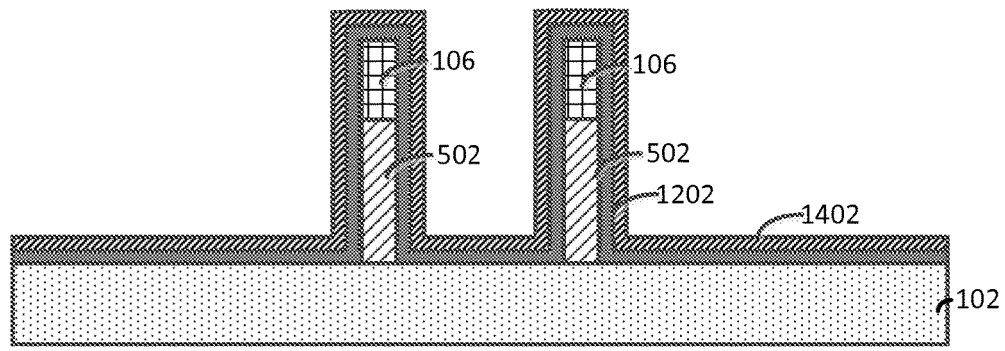
FIG. 14B illustrates a cut-away view of the structure along the line A-A of FIG. 14A.

FIG. 14B illustrates a cut-away view along the line A-A of FIG. 14A. The channel region shown includes a semiconductor fin 502 with a first dielectric layer 106 arranged on the fin 502, a second dielectric layer 1202 is arranged on the first dielectric layer 106 and sidewalls of the fin 502, the high-k dielectric layer 1402 is arranged on the second dielectric layer 1202.

Figure 14C:
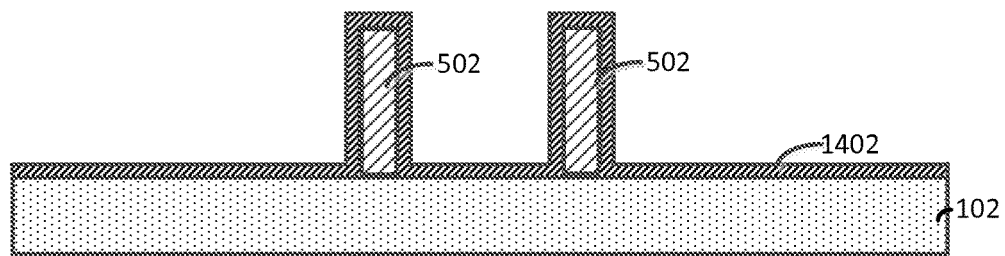
FIG. 14C illustrates a cut-away view of the structure along the line B-B of FIG. 14A.

FIG. 14C illustrates a cut-away view along the line B-B of FIG. 14A. The channel region of the fin 502 in the illustrated region includes the semiconductor fin 502 and the high-k dielectric material layer 1402 arranged on the fin 502.

Figure 15A:
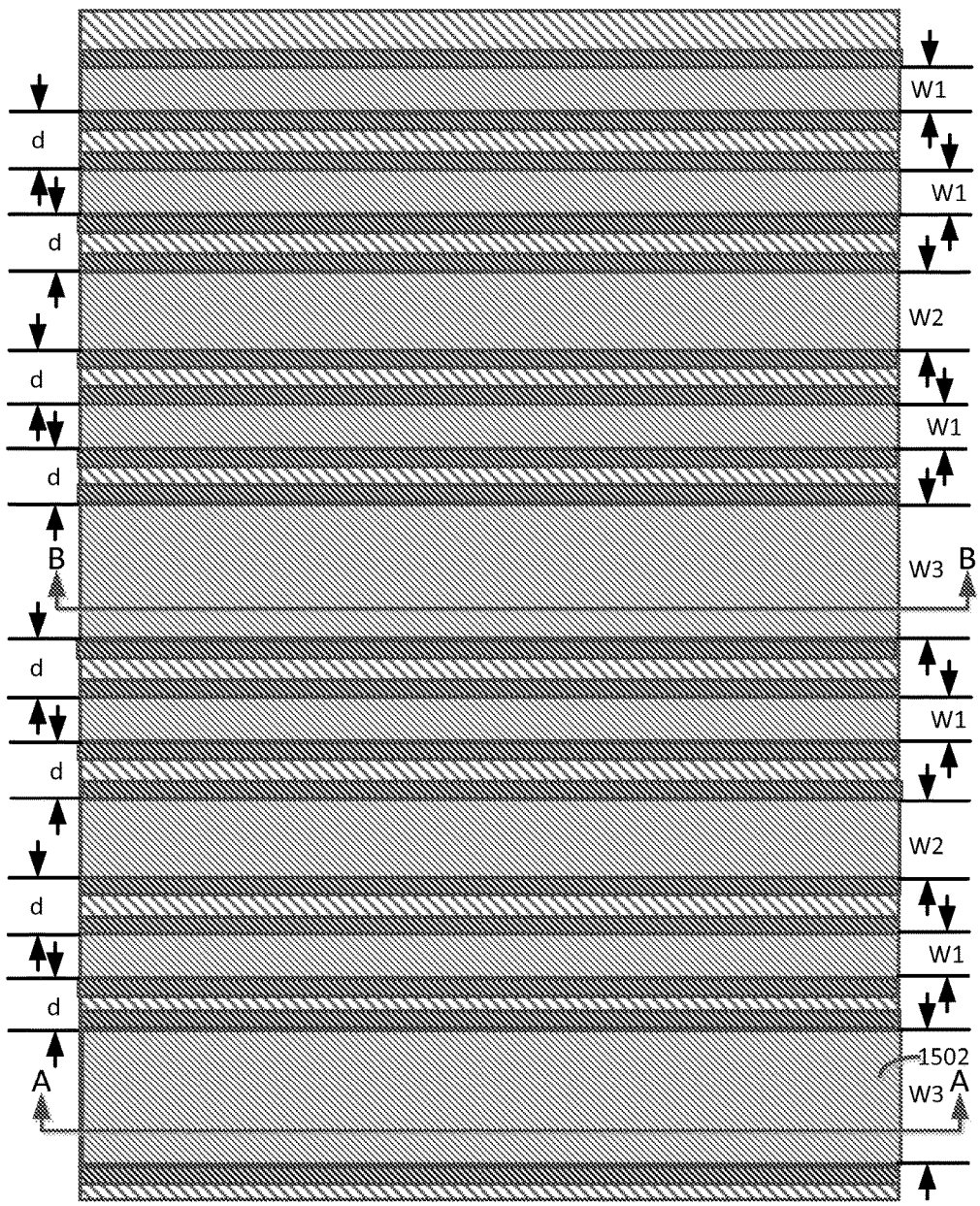
FIG. 15A illustrates the resultant structure following the formation of work function metal.

FIG. 15A illustrates the resultant structure following the formation of work function metal(s) 1502 disposed over the high-k dielectric material layer 1402 (of FIG. 4). The type of work function metal(s) depends on the type of device. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal 1502 is formed by a deposition process such as, for example, a spin-on process followed by a planarization process such as chemical mechanical polishing.

The gate stacks formed following the deposition of the work function metal remain spaced a uniform distance d while the gate stacks have varying widths L1, L2, and L3 where L1<L2<L3.

Figure 15B:
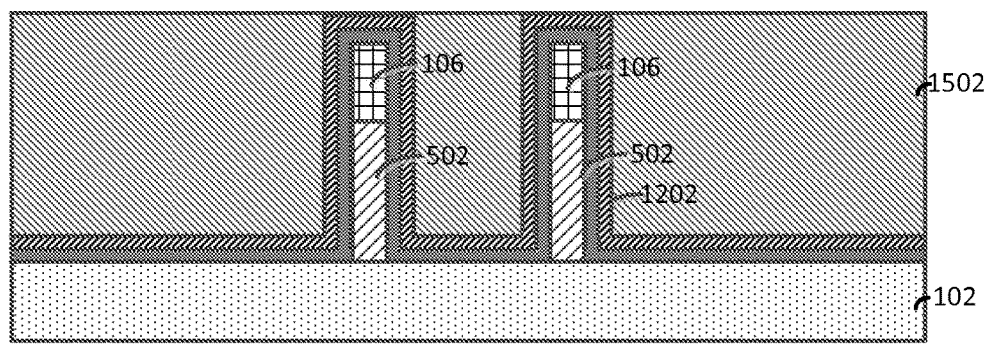
FIG. 15B illustrates a cut-away view of the structure along the line A-A of FIG. 15A.

FIG. 15B illustrates a cut-away view along the line A-A of FIG. 15A. The gate stack shown in FIG. 15B includes a dielectric layer 106 arranged on the semiconductor fin 502, a dielectric layer 1202 arranged on the dielectric layer 106 and the fin 502, and a high-k dielectric layer 1402 arranged on the dielectric layer 1202.

Figure 15C:
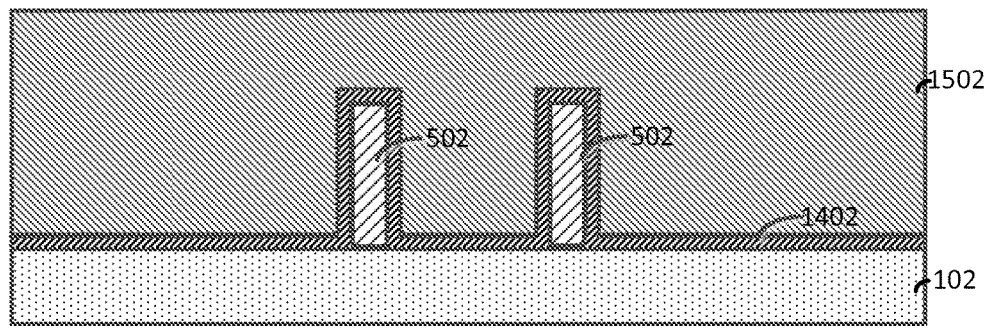

FIG. 15C illustrates a cut-away view along the line B-B of FIG. 15A. The gate stack of FIG. 15B has a single high-k dielectric layer 1402 arranged on the fin 502.

Though the illustrated embodiments include a test structure with devices that include active regions formed from fins, alternate embodiments may include active regions with any suitable geometries, including other types of multi-gate devices, nanowire, and other types of gate-all-around devices that include evenly spaced gates having different thicknesses of dielectric materials and different gate widths.

Thus, the exemplary embodiment of the test structure includes gate stacks having different widths, and different thicknesses of dielectric materials. The gate stacks are evenly spaced.

When measuring the actual gate lengths of the resultant devices, the testing arrangement provides for measuring the capacitance of the devices in the test structure. Since the gates of the devices are evenly spaced, have different widths, and different dielectric material properties, the parasitic capacitances of the devices may be differentiated from the actual capacitance of the devices. Once the parasitic capacitance is known, and the actual capacitance of the devices is determined, the widths of the gates may be mathematically determined as a function of the capacitance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:
1. A method for fabricating a test structure on a wafer, the method comprising:
   forming a semiconductor fin on a substrate;
   forming a first dummy gate stack over the fin, the first dummy gate stack having a first width;
   forming a second dummy gate stack over the fin, the second dummy gate stack having a second width;
   forming a third dummy gate stack over the fin, the third dummy gate stack having a third width, the first dummy gate stack is spaced a first distance from the second dummy gate stack, the second dummy gate stack spaced the first distance from the third dummy gate stack;
   forming a source/drain regions on exposed portions of the fin;
   removing the first dummy gate, the second dummy gate, and the third dummy gate to expose channel regions of the fin;
   depositing a layer of dielectric material over the channel regions of the fin;

depositing a block mask to obscure a channel region of the fin, the block mask formed on a first portion but not a second portion of a top surface of the layer of dielectric material;

removing the layer of dielectric material from exposed channel regions of the fin;

removing the block mask;

depositing a high-k dielectric layer; and depositing a work function metal to form a first gate stack, a second gate stack, and a third gate stack.

2. The method of claim 1, further comprising forming spacers adjacent to the first dummy gate stack, the second dummy gate stack and the third dummy gate stack prior to forming the source/drain regions.

3. The method of claim 1, wherein the forming the source/drain regions on exposed portions of the fin includes epitaxially growing a semiconductor material on exposed portions of the fin.

4. The method of claim 1, wherein the first width is greater than the second width.

5. The method of claim 1, wherein the second width is greater than the third width.

6. The method of claim 1, wherein the first gate stack includes the layer of dielectric material and the high-k dielectric layer, and the second gate stack includes the high-k dielectric layer.

7. The method of claim 1, wherein the third gate stack includes the high-k dielectric layer and the layer of dielectric material.

8. The method of claim 1, wherein the layer of dielectric material includes a low-k dielectric material.

9. The method of claim 1, wherein the source/drain regions, are substantially the same size and shape.

10. A method for fabricating a test structure on a wafer, the method comprising:

forming a fin on a substrate;

forming a first gate stack over the fin, the first gate stack having a first gate width, the first gate stack including a gate dielectric layer having a first thickness;

forming a second gate stack over the fin, the second gate stack having a second gate width, the second gate stack including a gate dielectric layer having a second thickness; and forming a third gate stack over the fin, the third gate stack having a third gate width, the third gate stack including a gate dielectric layer having the second thickness, wherein the first gate stack is arranged a first distance from the second gate stack and the second gate stack is arranged the first distance from the third gate stack, wherein the fin is a same such that the first gate stack, the second gate stack, and the third gate stack are each on the same fin, wherein the first gate stack, the second gate stack, and the third gate stack each have different gate widths on the same fin.

11. The method of claim 10, further comprising forming a fourth gate stack over the fin, the fourth gate stack having the first gate width, the first gate stack including a gate dielectric layer having the second thickness.

12. The method of claim 10, further comprising forming a fifth gate stack over the fin, the fifth gate stack having the second gate width, the fifth gate stack including a gate dielectric layer having the first thickness.

13. The method of claim 10, further comprising forming a sixth gate stack over the fin, the sixth gate stack having the third gate width, the sixth gate stack including a gate dielectric layer having the first thickness.

14. The method of claim 11, wherein the fourth gate stack, is arranged the first distance from the third gate stack.

15. A testing structure on a substrate, the structure comprising:

a semiconductor fin arranged on the substrate;

a first gate stack arranged over the fin, the first gate stack having a first gate width, the first gate stack including a gate dielectric layer having a first thickness;

a second gate stack arranged over the fin, the second gate stack having a second gate width, the second gate stack including a gate dielectric layer having a second thickness; and a third gate stack arranged over the fin, the third gate stack having a third gate width, the third gate stack including a gate dielectric layer having the second thickness, wherein the first gate stack is arranged a first distance from the second gate stack and the second gate stack is arranged the first distance from the third gate stack, wherein the fin is a same such that the first gate stack, the second gate stack, and the third gate stack are each on the same fin, wherein the first gate stack, the second gate stack, and the third gate stack each have different gate widths on the same fin.

16. The structure of claim 15, further comprising forming a fourth gate stack over the fin, the fourth gate stack having the first gate width, the first gate stack including a gate dielectric layer having the second thickness.

17. The structure of claim 15, further comprising forming a fifth gate stack over the fin, the fifth gate stack having the second gate width, the fifth gate stack including a gate dielectric layer having the first thickness.

18. The structure of claim 15, further comprising forming a sixth gate stack over the fin, the sixth gate stack having the third gate width, the sixth gate stack including a gate dielectric layer having the first thickness.

19. The structure of claim 16, wherein the fourth gate stack, is arranged the first distance from the third gate stack.

20. The structure of claim 17, wherein the fifth gate stack is arranged the first distance from the fourth gate stack.

\* \* \* \* \*